US006603858B1

(12) United States Patent
Raicevich et al.

(10) Patent No.: US 6,603,858 B1
(45) Date of Patent: Aug. 5, 2003

(54) MULTI-STRATEGY ARRAY PROCESSOR

(75) Inventors: George Raicevich, Stanmore (AU); Harvey Dillon, Turramurra (AU)

(73) Assignee: The University of Melbourne, Parkville (AU)

( * ) Notice: Subject to any disclaimer, the term of this patent is extended or adjusted under 35 U.S.C. 154(b) by 0 days.

(21) Appl. No.: 09/088,694

(22) Filed: Jun. 1, 1998

(30) Foreign Application Priority Data

Jun. 2, 1997 (AU) ........................................ PO 7141

(51) Int. Cl.[7] ........................................ H03G 3/20

(52) U.S. Cl. ........................ 381/57; 381/104; 381/107; 381/122

(58) Field of Search ........................ 381/56–57, 91, 381/92, 94.1, 104, 107, 109, 122, 94.7

(56) References Cited

U.S. PATENT DOCUMENTS

| | | | | | |
|---|---|---|---|---|---|
| 3,783,192 | A | | 1/1974 | Takahashi | 179/1 GQ |
| 3,922,488 | A | | 11/1975 | Gabr | 179/1 HF |
| 4,001,505 | A | | 1/1977 | Araseki et al. | 179/1 |
| 4,334,740 | A | | 6/1982 | Wray | 352/1 DM |
| 4,399,327 | A | | 8/1983 | Yamamoto et al. | 179/1 DM |
| 4,412,097 | A | | 10/1983 | Ishigaki et al. | 381/92 |
| 4,498,060 | A | | 2/1985 | Dolby | 333/14 |
| 4,535,471 | A | | 8/1985 | Kuroda | 381/2 |
| 4,536,887 | A | * | 8/1985 | Kaneda et al. | 381/92 |
| 4,712,244 | A | | 12/1987 | Zwicker et al. | 381/68.1 |
| 4,898,179 | A | | 2/1990 | Sirota | 128/670 |
| 4,956,867 | A | * | 9/1990 | Zurek et al. | 381/94.1 |
| 5,033,082 | A | | 7/1991 | Eriksson et al. | 379/410 |
| 5,033,090 | A | | 7/1991 | Weinrich | 381/68.4 |
| 5,214,709 | A | | 5/1993 | Ribic | 381/68.1 |
| 5,574,824 | A | * | 11/1996 | Slyh et al. | |
| 5,673,327 | A | * | 9/1997 | Julstrom | 381/57 |

FOREIGN PATENT DOCUMENTS

| | | | |
|---|---|---|---|
| GB | 2306086 | A | 4/1997 |
| WO | WO95/34983 | A1 | 12/1995 |
| WO | WO96/13096 | A1 | 5/1996 |

* cited by examiner

*Primary Examiner*—Duc Nguyen
(74) *Attorney, Agent, or Firm*—Gottlieb, Rackman & Reisman, P.C.

(57) ABSTRACT

An apparatus and method for processing sound, suitable for use in association with a hearing aid, cochlear implant prosthesis or the like. Coupled to an array of microphones (1) are a pair of fixed array processors (2,4) each having different characteristic signal-to-noise performances and internal noise parameters in different levels of ambient noise. Based upon an ambient noise estimate derived from noise floor detector (8) a control circuit (5) controls the gain of a pair of VCA's (7,9) coupled to the fixed array processors (2,4) in order to produce an output signal from summer (16) which maximises the signal-to-noise ratio of a signal emanating from a source in an on-beam direction relative to the microphone array (10).

13 Claims, 4 Drawing Sheets

MULTI-STRATEGY ARRAY PROCESSOR

FIELD OF THE INVENTION

The present invention relates to the field of devices for improving the speech perception of hearing impaired subjects. Such devices include acoustic hearing aids, tactile aids, cochlear prostheses and brain stem implants. In particular the invention is concerned with optimising the intelligibility of speech delivered to a subject by means of a directionally discriminating device.

BACKGROUND

In general the effects of hearing impairment are characterised by the undesirable conditioning of a speech signal along the subject's hearing chain so as to result in attenuation and often distortion of the signal. It has been found that a standard hearing aid which amplifies the ambient sound can compensate for hearing losses attributable to attenuation, however such systems are of little assistance in low signal-to-noise ratio conditions.

Therefore, while most hearing aids provide substantial relief to the hearing impaired in single speaker, low reverberation, environments they are less useful where several speech sources are present simultaneously with the one of interest to the subject or when used in a room exhibiting strong reverberation characteristics. This poor performance is because such conditions are more likely to result in a lower speech signal-to-noise ratio than is prevalent in a single speaker, low reverberation environment. The problem of aiding a hearing impaired subject in a noisy environment is not overcome merely by indiscriminately amplifying both the speech of interest as well as the background noise.

In order to address this problem directional hearing aids have been used. Such hearing aids are able to spatially discriminate between sound sources. These aids selectively amplify sound sources in a particular direction or "beam" relative to the aid.

A common method for producing spatial discrimination in a sound field has been to process the outputs from an array of microphones. Both fixed and adaptive array processors have been used. The principal property of adaptive array processors is that the microphone weights are continually adjusted with the array being statistically optimised according to some criterion. A problem with the adaptive array is that in a reverberant environment the processor may be unable to determine the direction of the desired signal and hence the weights to be adjusted. Consequently adaptive array processors will not be discussed further. In contrast, in a fixed array processor the signal processing components of the array are time-invariant, the fixed array using data independent weights and delays applied to the microphone outputs to create a maximum sensitivity to signals coming from a desired direction. There are many different types and configurations of fixed array processors. Each such processor has associated with it a degree of directivity and a particular level of inherent noise.

For example, one fixed processing arrangement which is well known in the art is based on addition and appropriate delay of the separate microphone outputs. Such an additive processor exhibits only moderate directionality however it can be used in relatively quiet environments because it has a greater signal-to-noise ratio than many more directional types of processor or indeed even a single microphone.

An alternative method for achieving spatial discrimination is to subtract the output of some of the separate microphones from the others. In this case the level of subtraction involved determines the amount by which off-beam sounds are suppressed. For example, second order subtraction, by which difference signals are subtracted from each other, affords a greater degree of suppression than first order subtraction, by which difference signals are added to each other, but has the disadvantage that whilst it strongly attenuates off-beam sounds it also attenuates the wanted signal to such an extent that internal microphone noise becomes significant when used in quiet surroundings. While subtractive processing has a higher directional performance than additive processing its ratio of signal to internal noise is poorer than that of the additive processor because of the increased on-beam attenuation. Details of the construction and theory of additive and subtractive sound processors are described in *Speech Intelligibility Enhancement Technique Multi Microphone Array* by G. Raicevich a Thesis for the degree of Master of Engineering, available from the library of the University of Technology Sydney, Broadway, Sydney, Australia.

In general, fixed array processors which have a relatively high directional performance and a relatively lower ratio of signal to internal noise, in quiet environments, such as the above described subtractive processor, are more suited to use in high noise situations. However in lower noise environments the converse is true and so it is preferable to use a fixed array which, whilst it may exhibit a lower directionality has the advantage of a significantly higher ratio of signal to internal noise.

Another type of fixed array processor is the so-called "Supergain". The constrained supergain array described in the paper *Practical Supergain*, by Henry Cox et al (IEEE Transactions on Acoustics Speech and Signal Processing Vol ASSP 34 No. 3 June 1986), applies complex weights to the individual microphone outputs of a microphone array. By modifying a frontal gain constraint the values of the weights may be calculated and the qualities of the supergain array may be controlled. For example, a supergain array processor may incorporate weighting which takes the background noise characteristics into account. In high background noise the resulting processor will have a lower frontal gain constraint and hence a higher directivity. The associated higher array internal noise will not unduly affect the signal-to-noise ratio. Conversely, when designing a supergain processor for use in a low background noise level environment, a higher frontal gain constraint will result in a lower directivity but a lower array internal noise.

While a fixed array processor may operate well in a particular noise environment its characteristics may not be ideal for operation as the background noise level of its environment changes. Consequently there is a need for a hearing aid which, while compact is also directional and able to adjust to changes in the noise environment without the drawbacks associated with adaptive arrays.

It is an object of the present invention to provide a system by which a fixed array processing strategy is determined according to prevailing environmental conditions, preferably the level of ambient noise floor, so as to maximise the speech signal-to-noise ratio of a spatially discriminating aid for the hearing impaired.

It is a further object of the present invention to provide a system by which the complex weights of a constrained supergain array may be adjusted in order to maximise the overall signal-to-noise ratio of the processor given the prevailing acoustic environment in which the array is used.

SUMMARY OF THE INVENTION

According to a first aspect of the present invention there is provided a method for processing sound comprising the steps of:

a) determining the signal-to-noise performance of a plurality of fixed microphone array processors for a range of ambient noise levels;

b) monitoring a parameter indicative of ambient noise conditions to determine the prevailing ambient noise level;

c) determining the operating parameters of a microphone array processor being the microphone array processor of said plurality of microphone array proccessors having the highest signal-to-noise performance in the prevailing ambient noise level; and d) processing the output of a microphone array with a processor having the operating parameters of the processor selected in step c).

According to a further aspect of the present invention there is provided An apparatus for processing sound comprising:

a) an array of microphones;

b) first and second array processors coupled to said array, each of said processors arranged to produce a characteristic total noise output being a function of ambient noise floor, the first processor being arranged to produce a lower characteristic total noise output than the second processor over a first range of values of noise floor, and the second processor being arranged to produce a lower characteristic total noise output than the first processor over a second range of values of said noise floor;

c) a noise floor indicating circuit coupled to at least one microphone of said array of microphones arranged to produce a noise floor signal indicative of said ambient noise floor;

d) control means coupled to said noise floor indicating circuit and arranged to produce first and second control signals indicating when said noise floor signal is in said first range of values or in said second range of values;

e) first and second variable gain means, the first and second variable gain means being coupled to the first and second microphone array processor, and being responsive to the first and second control signal respectively, the first and second variable gain means arranged to apply variable gain to the characteristic total noise output of the first and second array processor, respectively, the control means and said first and second variable gain means being further arranged so that the gain applied by the first variable gain means is greater than the gain applied by the second variable gain means when said noise floor signal is within said first range and the gain applied by the second variable gain means is greater than the gain applied by the first variable gain means when said noise floor is within said second range.

According to a further aspect of the invention there is provided an apparatus for processing sound comprising:

a) an array of microphones;

b) first and second array processors coupled to said array of microphones, each of said processors arranged to produce a characteristic total noise output being a function of ambient noise, the first processor being arranged to produce a lower characteristic total noise output than the second processor over a first range of values of ambient noise, and the second processor being arranged to produce a lower characteristic total noise output than the first processor over a second range of values of said ambient noise;

c) background noise processor coupled to said microphone array and arranged to have maximum sensitivity to background noise said background noise processor producing a background noise signal;

d) on-beam signal detect circuit responsive to said background noise processor and to output from said first and second array processors for producing a detect signal indicative of the presence of on-beam signal;

e) first and second sample-and-hold circuits coupled to said first and second processors respectively and being responsive to said detect signal, said first and second sample-and-hold circuits arranged to produce first and second ambient noise estimates;

f) control circuit coupled to said first and second sample-and-hold circuits and arranged to produce first and second control signals to indicate relative magnitudes of said first and second noise estimates;

g) first and second variable gain circuits coupled to the first and second array processor, respectively, the first and second variable gain circuits being responsive to the first and second control signal, respectively, and arranged to apply variable gain to the characteristic total noise output of the first and second array processor, respectively, the control circuit and said first and second variable gain circuits being further arranged so that when said first noise estimate is less than said second noise estimate said gain applied by the first variable gain circuit is greater than said gain applied by the second variable gain circuit and when said second noise estimate is less than said first noise estimate said gain applied by the second variable gain circuit is greater than said gain applied by the first variable gain circuit.

According to a final aspect there is provided an apparatus for processing sound comprising:

a) a microphone array comprising a plurality of microphones each microphone producing a signal corresponding to surrounding ambient sound;

b) a plurality of antialiasing filters coupled to each microphone of said array respectively, each antialiasing filter arranged to produce a low-pass filtered signal;

c) a plurality of analog to digital converters coupled to each antialiasing filter respectively, each analog to digital converter arranged to produce a digital noise signal;

d) a microphone array processor coupled to said analog to digital converters arranged to produce a noise level signal indicative of the ambient noise level;

e) an allocation means responsive to said noise level signal and arranged to produce a plurality of weighting signals in accordance with a predetermined rule;

f) a plurality of digital multiplier means coupled to each analog to digital converter and respectively responsive to said plurality of weighting signals, each said multiplier arranged to perform a complex multiplication operation on each digital noise signal respectively, said plurality of digital multipliers producing a corresponding plurality of multiplied signals;

g) means for delivering said plurality of multiplied signals for further processing.

The invention also extends to acoustic hearing aids, tactile aids, cochlear prostheses, brain stem implants and other aids to hearing which incorporate the above described inventive features.

DESCRIPTION OF THE PREFERRED EMBODIMENTS

Figure 1:
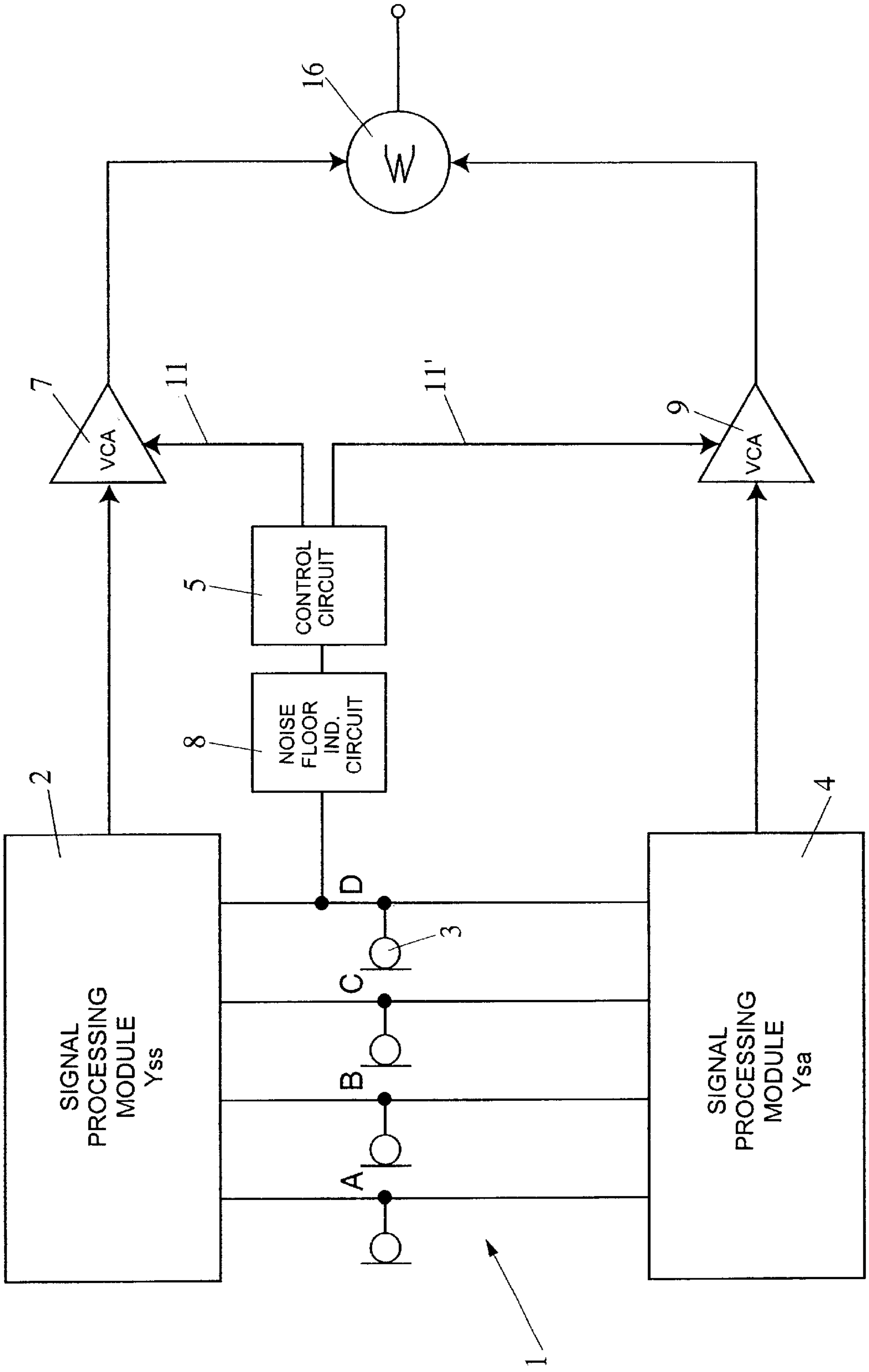
FIG. 1 depicts the present invention according to a first embodiment.

The present invention will now be described according to a preferred embodiment. Referring now to FIG. 1, depicted is a microphone array 1 consisting of a number of microphones. In the present example four microphones are shown however other numbers are also possible and the invention is not limited to the number of microphones used herein. The outputs of the microphones are labelled from A to D. According to a first embodiment the microphone outputs are passed to two different signal processing modules named Yss and Ysa and denoted as items 2 and 4 respectively.

Although in the present example only two processors are shown it is possible to have a greater number of processors in which case selection between them is also made according to the criteria explained herein. Furthermore the invention may be embodied by means of a single processor configurable into two or more modes. In that case selection between processing modes is also made according to the criteria explained herein.

Returning now to the embodiment of FIG. 1, relative to Ysa the first signal processing module Yss 2 is characterised by having a greater directionality but also a lower ratio of signal to internal noise. In contrast the second signal processing module Ysa has a higher ratio of signal to internal noise and a lower degree of directionality.

One of the microphones 3 of the array is monitored and its output passed to a noise floor indicating circuit 8. Such circuits are known in the art, for example, a simple noise floor indicating circuit typically consists of an AC coupling capacitor followed by a rectifier and low pass filter. As the noise floor usually has a magnitude similar to the signal envelope, monitoring of the envelope provides an indication of the noise floor subsequent to appropriate scaling.

The output of the noise floor detector comprises a relatively slowly moving DC signal indicative of the ambient noise floor. The DC signal from the noise floor indicator is coupled to control circuit 5. Emanating from control circuit 5 are two control lines 11 and 11'. Control circuit 5 contains an inverting amplifier which is connected between the output from the noise floor detector 8 and control line 11'. It also contains a buffer amplifier or depending on the remainder of the circuitry used a conductor, connected between the output of the noise floor detector 8 and control line 11. Control line 11' is connected to voltage controlled amplifier 9 which is also connected to the output of Ysa, 4. Contol line 11 is similarly connected to voltage controlled amplifier 7 which is also connected to the output of Yss, 2.

The outputs of VCA 7 and VCA 9 are added together by summer 16, which may consist of an appropriately configured operational amplifier, and then passed to a conventional hearing aid device (not shown).

Figure 2:
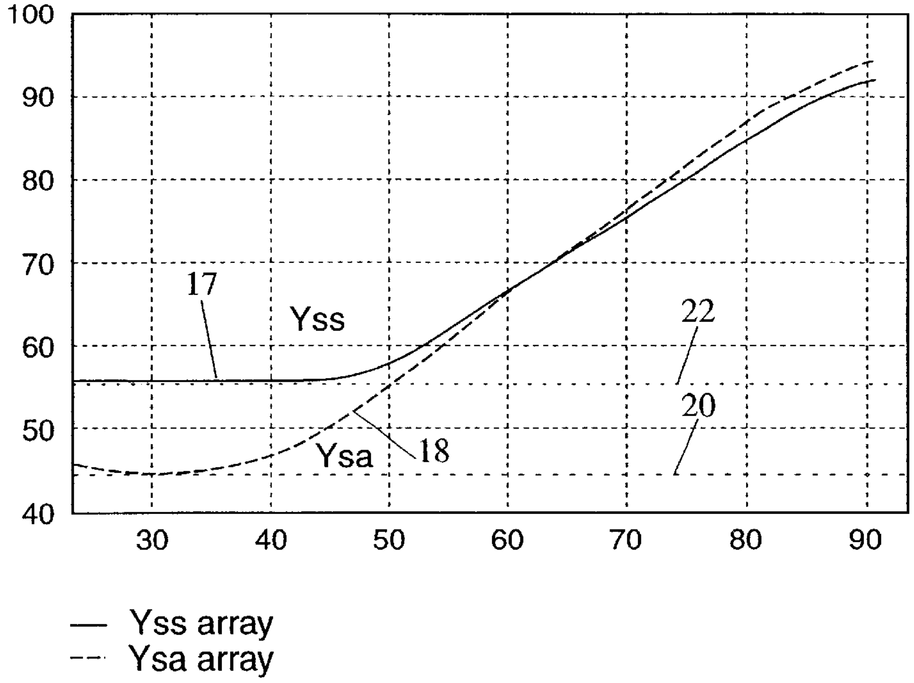
FIG. 2 depicts the relative performance in varying background noise of two different microphone array processors.

Referring now to FIG. 2 the operation of the device will be explained. FIG. 2 illustrates the noise discrimination ability for the subtractive 2 and additive 4 processors. The Figure depicts the characteristic outputs of Ysa and Yss in dB's on the vertical axis plotted againsT ambient acoustic noise floor, in dBs on the horizontal axis. It will be noted that as the ambient noise falls to low values, depicted as region A of FIG. 3, the output of Yss 2 and Ysa 4 are substantially due to electrical noise internally generated in the processors and microphone array. A lower processor output for a given noise floor level indicates a higher directivity and hence better sound discrimination ability. It is seen from the graph of FIG. 2 that the Yss processor output, line 17 indicates a better performance when the noise floor has a high value, i.e. to the right of the intersection point of the two curves. Whereas the Ysa output, line 16 is lower in low acoustic ambient noise conditions. The graph also shows that both array outputs plateau in the lower noise regions. As the ambient noise levels drop, the array outputs remain constant. Such plateauing indicates that the array output is dominated by internally generated noise. The subtractive processor Yss, while exhibiting greater spatial discrimination, also produces more internal noise as is evident by the relatively high plateau, line 22, found on the left hand side of its plot, relative to the plateau of Ysa, depicted by line 20.

According to the invention the noise floor detector B, control circuit 5 and VCA's 7, 9 are scaled so that as the noise floor indicative signal drops VCA 7 attenuates whilst the gain of VCA 9 increases so that the output of summer 16 is substantially Ysa, which is appropriate for the low noise environment. Alternatively, as the ambient noise increases the second order subtractive processor Yss becomes preferred and so by the design of the device in FIG. 1 VGA 7 increases its gain whilst that of VCA 9 is attenuated, the output of summer 16 becoming substantially that of Yss.

Figure 3:
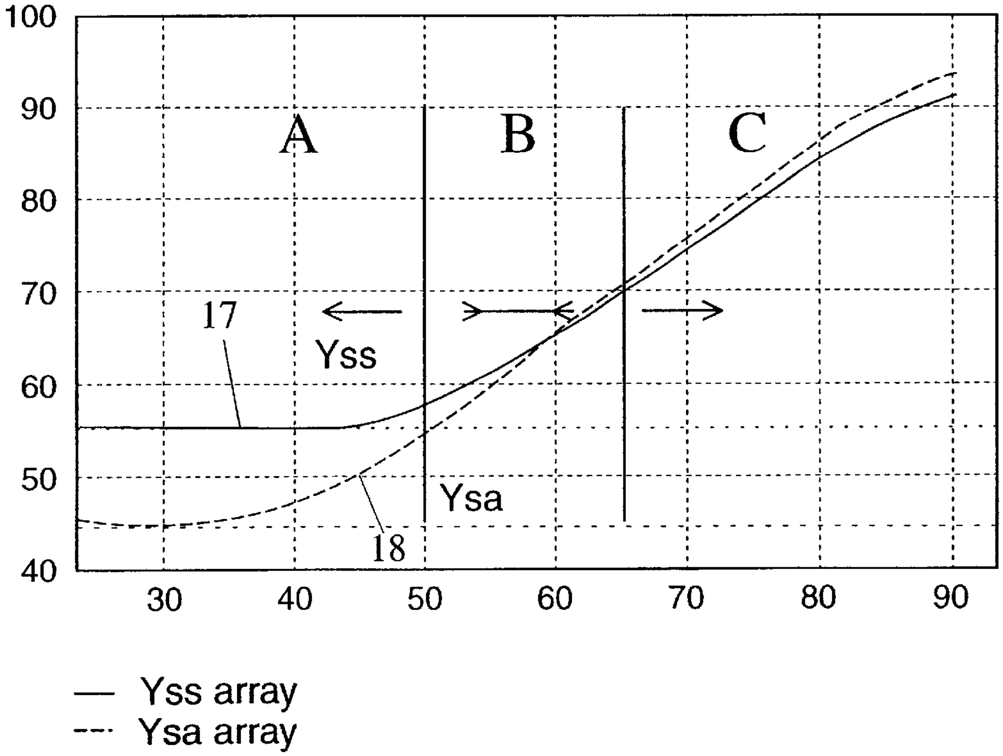
FIG. 3 depicts three regions of the graph shown in FIG. 2.

Referring now to FIG. 3 there is depicted a version of FIG. 2 wherein the acoustic ambient noise has been demarcated into three ranges A, B and C. It can be seen that VCA's 7 and 9 are controlled by the noise floor detector 8 so that the output of the summer 16 predominantly consists of the output of the processor which provides the lowest total noise output. Consequently, in region A of the graph the output of the summer consists entirely of signal from Ysa 4. In region B of the graph the output of the summer consists of a mixture of both processors. Leftward of the point at which the curves 17, 18 characteristic of each of the processors intersect the summer output is increasingly Ysa 4. Rightward of the intersection point it is increasingly Yss 2. At the point of intersection it is equally due to signal from Ysa and Yss. In region C of the graph the output of the summer consists entirely of signal from Yss.

In practice the system is calibrated for switchover by noting the output from the noise floor detector at which the intersection of curves 17 and 18 occurs. The VCA's are then adjusted so that complete switchover from one processor to the other takes place within a cross-over range centred on the intersection point. It has been found that a cross-over range a little greater than 6dB is required in order to minimise the subject's perception of the change in processing strategies. Whilst the blending of the two signals which occurs in cross-over range B is not essential to the invention, it makes the device more comfortable for the subject by reducing the perception of the switching between processing strategies.

Consequently the invention could be implemented by automatically switching between the two strategies at the point where their characteristic processor curves intersect rather than blending the output of the two processors across cross-over range B. Furthermore, although not incorporated into the embodiments herein described, hysteresis could be introduced into the switching or blending operation so that switchover would occur at different values of external noise depending on whether the external noise was increasing or decreasing.

According to a further embodiment of the present invention an auto switching arrangement comprising processor microphone array processor Yn, signal detector circuit 40 and sample-and-hold (S/H) circuits 41 and 42 is provided. The S/H circuits contain magnitude estimator circuits, to receive signal from Ysa 4 and Yss 2, comprising a rectifier and low pass filter to generate a rectified and time averaged value indicative of the magnitude of the signal emanating from Ysa and Yss. The S/H circuits are under command of on-beam signal detector 43 from which they take a control signal which determines whether they are to sample signal derived from Ysa and Yss, or to hold. The auto switch-over system automatically chooses the most appropriate proportions of output of array processors Yss 2 and Ysa 4 in order to maximise the ratio of desired signal to undesired ambient noise. The ambient noise output by the processors is a combination of acoustic ambient noise and electrical noise emanating from the processors and microphone array.

Figure 4:
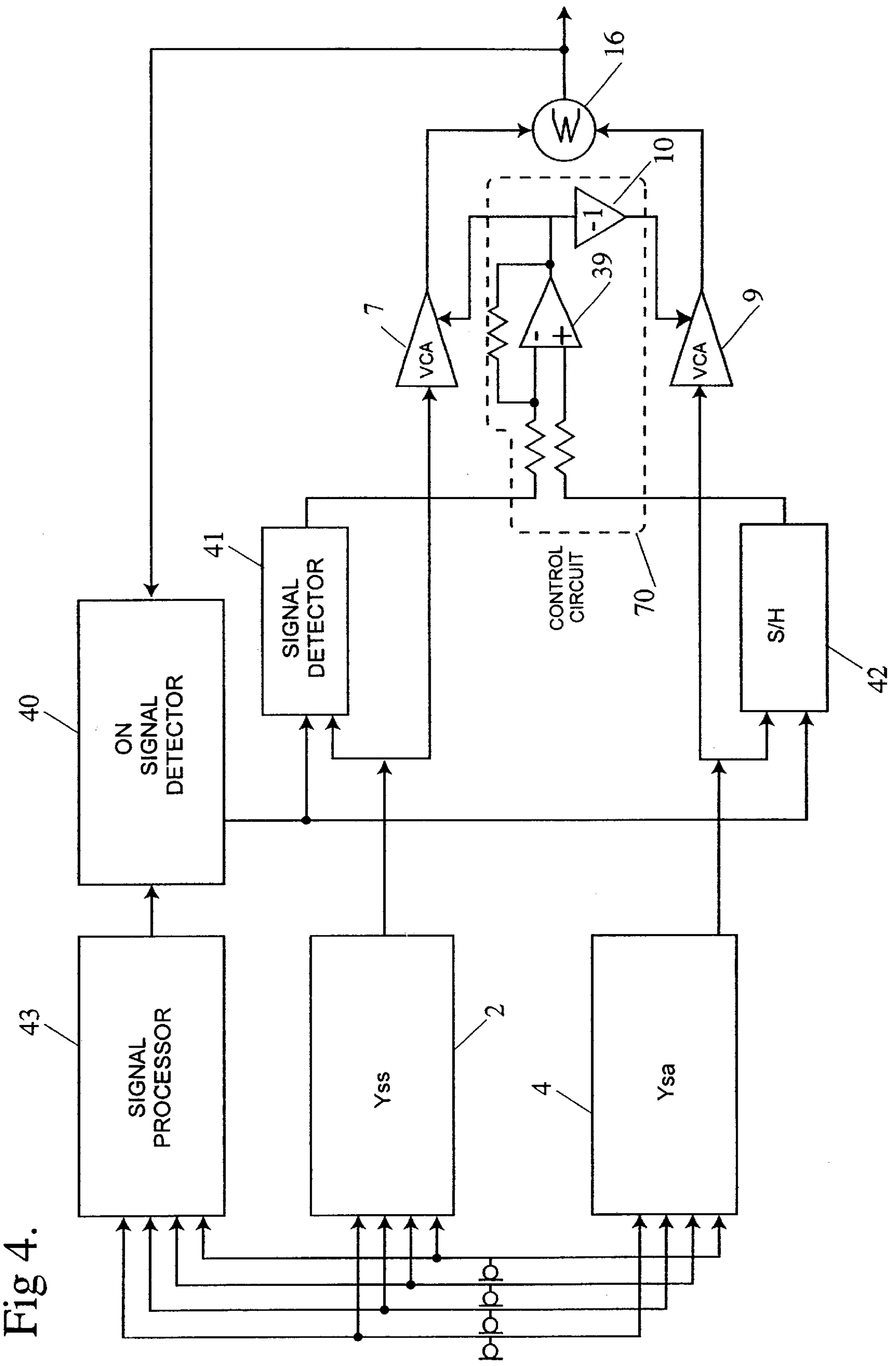
FIG. 4 depicts the present invention according to a second embodiment.

On-beam signal detector 40 takes two inputs. A first input emanates from processor Yn 43. Processor 43 is a microphone array processor whose output is minimally sensitive to the on-beam signal that processors Ysa and Yss are designed to maximise. For example if the device of FIG. 4 were to be used in a crowded room, including people speaking and other sound sources, then whilst Ysa and Yss are designed to optimise the signal coming from a particular direction relative to the microphone array, and minimise the remaining noise, Yn, in contrast generates an output that monitors the remaining noise. The inventors have found that a processor constructed similarly to Ysa or Yss except having maximum sensitivity in a direction opposite to the desired on-beam direction of Yss and Ysa, is suitable for this purpose.

The second input to signal detector 40 emanates from the output of summer 16 which is a combination of signals from Yss 2 and Ysa 4.

Signal detector 40 takes the signal from Yn 43 and produces an estimate of its average value over a short period of time, this may be done by rectifying the signal and then low pass filtering it as was described in respect of noise floor indicating circuit a of FIG. 1. Signal detector 40 also processes the signal from summer 16 in a similar manner. The two rectified and averaged signals are then compared to produce their difference being the processed signal from Yn 43 minus the processed signal from summer 16. The difference signal is passed through a comparator. The comparator produces a logic high detect signal in the event that the difference signal is positive and a logic low detect signal in the event that it is less than or equal to zero. Accordingly, if the signal coming from the summer is of greater magnitude than the signal from processor Yn 43 then signal detector 40 will generate a logic low signal which will indicate that the output of summer 16 contains signal other than ambient noise. Conversely, if the signal coming from processor Yn 43 is of greater magnitude than the signal from summer 16 then signal detector 43 will generate a logic high output to indicate that the output of summer 16 does not contain signal of interest.

In the event that the output of summer 16 does contain signal of interest the detect signal will be low. In that case S/H circuits 41 and 42 hold their current values so that the output of differential amplifier 39 remains constant. In that event the gains of VCA's 7 and 9 remain constant so that there is no change in the relevant propotions of the signals from Ysa 4 and Yss 2 delivered to summer 16.

Alternatively, in the event that the output of summer 16 does not contain signal of interest, the detect signal will be high. In that case S/H circuit 41 will track signal from Yss 2 while signal from Ysa 4 will be tracked by S/H circuit 42. During this state the outputs of S/H circuits 41 and 42 will be approximately the same as those from processors Yss 2 and Ysa 4. Accordingly, when the ambient noise level is low, i.e. the processors are operating in region A of FIG. 3, then the output of S/H circuit 41 will be greater than the output of S/H circuit 42. Consequently, the output of differential amplifier 39 will be negative so that the gain of VCA 7 will be low relative to the gain of VCA 9. It should be noted that the control signal for VCA 9 is passed through inverter 10 so that it is of opposite polarity to that which controls VCA 7. As a result the output of summer 16 will be predominantly signal from Ysa 4 which, as can be seen from FIG. 3, is of markedly lower noise in Region A than that of Yss 4.

When the ambient noise level is within Range B of FIG. 3 then the gain applied to VCA's 7 and 9 will be largely equal so that output from both Yss 2 and Ysa 4 with the output of summer 16 comprised of approximately 50% signal from each of those processors.

Finally when the ambient noise climbs into Region C of the graph the output of Ysa 4 will be greater than that of Yss 2 so that the output of differential amplifier 39 will be positive. Accordingly more gain will be applied to output from Yss 2 than from Ysa 4 and the output of summer 16 will be predominantly due to signal from Yss 2, which has a lower noise level in the Region C range of operation.

Figure 5:
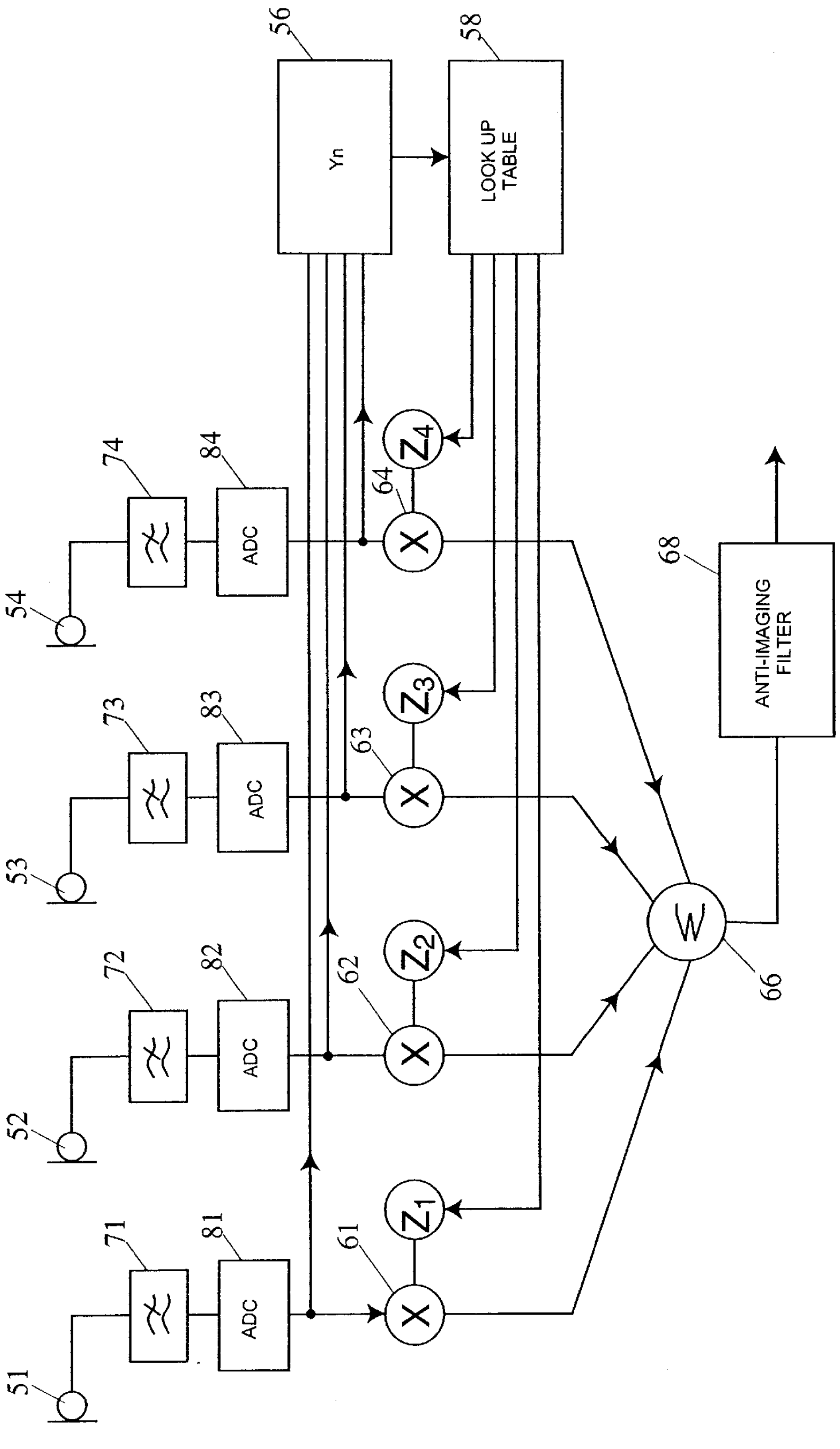
FIG. 5 depicts the present invention according to a third embodiment.

Referring now to FIG. 5 there is depicted an embodiment of the present invention as applied to a constrained supergain array processor. Such a processor conventionally consists of a series of microphones 51–54 spaced less than one half wavelength, of the centre frequency of the band to be processed, apart. The outputs of each microphone are each multiplied by a complex weight z1 . . . z4, by complex multipliers 61–64. This operation is most conveniently performed using digital techniques and so, prior to multiplication, the signals are passed through anti-aliasing filters 71–74 and converted to digital signals by ADC's 81–84 according to standard methods.

It is known to calculate the weights z1 . . . z4 for a single level of ambient acoustic noise. However, such an approach does not provide for changes in the background noise level which may render the processor less than effective as noise levels change. According to the invention, as background noise levels increase the weights may be altered so that the directionality of the processor may be increased without introducing unwanted instabilities into the processor. Conversely, as the background noise level decreases it is necessary to reduce the directionality of the processor in order to minimise the total noise at the output of the summer 66.

According to the present invention noise level processor Yn 56 and allocation means, being look up table 58, are provided to alter the weights z1 . . . z4. Processor Yn generates an estimate of the ambient acoustic noise level. This estimate is sent to look up table 58 which contains a list of precalculated values for z1 . . . z4 for given values of ambient acoustic noise level. Calculation of the weighting values is described in the formerly referenced paper by Cox et al.

As a variation to the use of a look up table it is possible to instead calculate the values for the weights as required. In that case the allocation means would not consist of look-up table 58 but instead would be replaced by calculations undertaken in a central digital signal processor or alternatively by a suitable co-processor.

The weighted digital signals are combined, shown schematically by summer 66, and the resulting signal optionally converted to an analog signal by DAC and associated anti-imaging filtering 68.

Although the invention has been described with reference to a limited number of embodiments other variations are possible within the inventive concept and will be apparent to those skilled in the art.

We claim:

1. An apparatus for processing sound comprising a) an array of microphones;

b) first and second array processors coupled to said array, each of said processors arranged to produce a characteristic total noise output being a function of ambient noise, the first processor being arranged to produce a lower characteristic total noise output than the second processor over a first range of values of said noise, and the second processor being arranged to produce a lower characteristic total noise output than the first processor over a second range of values of said said noise;

c) a noise floor indicating circuit coupled to at least one microphone of said array of microphones arranged to produce a noise floor signal indicative of said ambient ambient noise;

d) control means coupled to said noise floor indicating circuit and arranged to produce first and second control signals indicating when said ambient noise signal is in said first range of values or in said second range of values;

e) first and second variable gain means, the first and second variable gain means being coupled to the first and second microphone array processor, and being responsive to the first and second control signal respectively, the first and second variable gain means arranged to apply variable gain to the characteristic total noise output of the first and second array processor, respectively the control means and said first and second variable gain means being further arranged so that the gain applied by the first variable gain means is greater than the gain applied by the second variable gain means when said ambient noise signal is within said first range and the gain applied by the second variable gain means is greater than the gain applied by the first variable gain means when said ambient noise is within said second range.

2. An apparatus according to claim 1, further comprising a summing means coupled to said first variable gain means and to said second variable gain means.

3. An apparatus according to claim 1, wherein the first array processor is a subtractive processor.

4. An apparatus according to claim 1 or claim 3, wherein the second array processor is an additive processor.

5. An apparatus according to claim 1, wherein the control means and first and second variable gain means are further arranged so that the gain applied by the first variable gain means gradually increases and the gain applied by the second variable gain means gradually decreases as said ambient noise signal takes values across a sub-range from a starting value within said second range to a terminating value within said first range.

6. An apparatus according to claim 1, wherein the control means and first and second variable gain means are further arranged so that the gain applied by the first variable gain means gradually decreases and the gain applied by the second variable gain means gradually increases as said ambient noise signal takes values across a sub-range from a starting value within said first range to a terminating value within said second range.

7. An apparatus according to claim 5 or claim 6, wherein the control means and the first and second variable gain means are further arranged so that said sub-range is centred at the value of ambient noise signal where said first and second ranges are in contiguity.

8. An apparatus according to claim 1, wherein the first and second variable gain means comprise voltage controlled amplifiers, and wherein said first and second control signals are voltage signals.

9. An apparatus for processing sound comprising:

a) an array of microphones;

b) first and second array processors coupled to said array of microphones, each of said processors arranged to produce a characteristic total noise output being a function of ambient noise, the first processor being arranged to produce a lower characteristic total noise output than the second processor over a first range of values of ambient noise, and the second processor being arranged to produce a lower characteristic total noise output than the first processor over a second range of values of said ambient noise;

c) background noise processor coupled to said microphone array and arranged to have maximum sensitivity to background noise said background noise processor producing a background noise signal;

d) on-beam signal detect circuit responsive to said background noise processor and to output from said first and second array processors for producing a detect signal indicative of the presence of on-beam signal;

e) first and second sample-and-hold circuits coupled to said first and second processors respectively and being responsive to said detect signal, said first and second sample-and-hold circuits arranged to produce first and second ambient noise estimates;

f) control circuit coupled to said first and second sample-and-hold circuits and arranged to produce first and second control signals to indicate relative magnitudes of said first and second noise estimates;

g) first and second variable gain circuits coupled to the first and second array processor, respectively, the first and second variable gain circuits being responsive to the first and second control signal, respectively, and arranged to apply variable gain to the characteristic total noise output of the first and second array processor, respectively, the control circuit and said first and second variable gain circuits being further arranged so that when said first noise estimate is less than said second noise estimate said gain applied by the first variable gain circuit is greater than said gain applied by the second variable gain circuit and when said second noise estimate is less than said first noise estimate said gain applied by the second variable gain circuit is greater than said gain applied by the first variable gain circuit.

10. An apparatus according to claim 9, further comprising a summing means coupled to said first and second variable gain circuit to produce a summation output signal.

11. A method for processing ambient sound comprising the steps of:

a) monitoring said ambient sound by means of an additive processor and a subtractive processor, said additive processor producing lower characteristic total noise output than said subtractive processor over a first range of values of ambient noise and said subtractive processor producing lower characteristic total noise output that said additive processor over a second range of values of said ambient noise, said processors being coupled to a common microphone array and producing processed signals;

b) determining which of said processed signals has the greatest signal to noise ratio for a given value of said ambient noise; and c) selecting the processed signal determined in step b) for further processing.

12. A method according to claim 11 further comprising the step of:

d) summing the processed signals in a ratio wherein a greater proportion of the signal selected in step c) is added.

13. An apparatus according to claim 1 wherein one of said first and second array processors is an additive signal processor and the other processor is a subtractive signal processor.

* * * * *